US010297311B1

(12) United States Patent
Yuan et al.

(10) Patent No.: US 10,297,311 B1
(45) Date of Patent: May 21, 2019

(54) SYSTEMS AND METHODS FOR MEMORY PROTOCOL TRAINING

(71) Applicant: Cadence Design Systems, Inc., San Jose, CA (US)

(72) Inventors: Wei Yuan, Shanghai (CN); Xiaobo Zhang, Beijing (CN); Yanjuan Zhan, Beijing (CN); Yuan Li, Beijing (CN)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 15/884,361

(22) Filed: Jan. 30, 2018

(51) Int. Cl.
*G11C 7/00* (2006.01)
*G11C 11/4096* (2006.01)
*G11C 11/4076* (2006.01)

(52) U.S. Cl.
CPC ...... *G11C 11/4096* (2013.01); *G11C 11/4076* (2013.01)

(58) Field of Classification Search
CPC ........................ G11C 11/4096; G11C 11/4076
USPC .......................................................... 365/193
See application file for complete search history.

(56) References Cited

U.S. PATENT DOCUMENTS 6,316,980 B1 * 11/2001 Vogt .................... G11C 7/1051 327/241
6,442,102 B1 8/2002 Borkenhagen et al.
7,558,132 B2 7/2009 Carnevale et al.
7,594,750 B2 9/2009 Lee et al.
8,565,034 B1 * 10/2013 Lu ....................... G06F 13/1689 365/189.05
2007/0233942 A1 10/2007 Huang

OTHER PUBLICATIONS

Bae, Yong-Cheol, et al., "A 1.2V 30nm 1.6Gb/s/pin 4Gb LPDDR3 SDRAM with Input Skew Calibration and Enhanced Control Scheme", ISSCC Dig. Tech. Papers, (Feb. 2012), 44-46.

Lee, Ho Joon, et al., "A Process Tolerant Semi-Self Impedance Calibration Method for LPDDR4 Memory Controller", IEEE 58th International Midwest Symposium on Circuit and Systems (MWSCAS), (Aug. 2015), 1-4.

Rai, Devendra, et al., "A Calibration Based Thermal Modeling Technique for Complex Multicore Systems", Design, Automation & Test in Europe Conference & Exhibition (DATE), 2015, (Mar. 2015), 1138-1143.

Seo, Munkyo, et al., "A Blind Calibration Technique to Correct Memory Errors in Amplifier-sharing Pipelined ADCs", IEEE International Symposium on Circuit and Systems, (2007), 3610-3613.

* cited by examiner

*Primary Examiner* — Vu A Le
(74) *Attorney, Agent, or Firm* — Schwegman Lundberg & Woessner, P.A.

(57) ABSTRACT

Various embodiments provide for determining a delay of a data signal with respect to a data strobe signal within a memory system comprising a memory controller and a memory module. In particular, some embodiments adjust a phase between a data signal and a data strobe signal such that a data eye of the data signal arrives at a receiver latch of a memory module can be centered on a transition of the data strobe signal. By centering the data eye of the data signal with the transition of the data strobe signal, various embodiments can ensure that the data strobe signal transition falls between the leading and trailing edges of the data eye, which in turn permits the memory module to obtain correct data from the memory controller during a write operation.

20 Claims, 12 Drawing Sheets

300

DETECT A LEADING EDGE OF A DATA EYE OF A DATA SIGNAL (302)

DETECT A TRAILING EDGE OF THE DATA EYE OF THE DATA SIGNAL (304)

DETERMINE A REFERENCE DELAY VALUE FOR THE DATA SIGNAL BASED ON A DELAY OF THE LEADING EDGE AND A DELAY OF THE TRAILING EDGE (306)

ADJUST A DELAY OF THE DATA SIGNAL BASED ON THE REFERENCE DELAY VALUE (308)

SYSTEMS AND METHODS FOR MEMORY PROTOCOL TRAINING

TECHNICAL FIELD

Embodiments described herein relate to memory and, more particularly, to systems, methods, devices, and instructions for memory protocol training.

BACKGROUND

Memory systems, such as those based on Double Data Rate (DDR) Synchronous Dynamic Random-Access Memory (SDRAM), define and use a set of data strobe (DQS) signals to strobe (e.g., sample) data during a memory write operation, and a set of (corresponding) input/output data (DQ) signals for writing data bits to, and reading data bits from, a memory module (e.g., DRAM module).

Generally, a particular DQS signal is generated by a memory controller during a write operation, where each transition of a DQS signal indicates a sample point for a particular DQ signal and the DQS signal has a setup/hold requirement when memory (e.g., DRAM module) uses it to strobe (e.g., sample) the particular DQ signal. Additionally, memory systems may further use a set of data mask (DM) signals to indicate which DQ signals should be interpreted as valid data or non-valid data during a sampling period, which is indicated by corresponding DQS signals. Accordingly, the timing of DQ signals and DM signals, relative to DQS signals, can be important for proper operation of a memory system.

To improve memory access signals between a memory module (e.g., DRAM modules) and a memory controller, a memory system performs a training (or calibration) process that delays a DQ signal relative to its corresponding DQS signal such that the DQS signal is centered with of a data eye of the DQ signal and the data eye of the DQ signal arriving at a receiver latch (of the memory module) centered on the transition of the DQS signal. The range timing from the beginning to the end of valid data is referred to as a valid data eye, which is defined by two edges. Data between the two edges is considered valid and can be correctly latched by the memory module, while data outside of the two edges are considered invalid. Accordingly, the DQS signal should fall between the edges of the data eye to obtain correct data, the DQS signal should fall between the edges of the data eye for the memory to obtain correct data during a memory write operation. The data eye tends to become narrower as memory speeds increase and various conditions relating to a memory system (e.g., printed circuit board (PCB) delays) can cause the data eye to drift.

Though certain memory systems, such as Low Power Double Data Rate 4 (LPDDR4) memory systems, have a WDQ training process for delaying a DQ signal relative to its corresponding DQS signal, other memory systems, such as Double Data Rate 3 (DDR3), Double Data Rate 4 (DDR4), Low Power Double Data Rate 3 (LPDDR3) and other memory systems, lack a training process for delaying a DQ signal relative to its corresponding DQS signal. Additionally, as memory systems, such as those using DRAM, operate at higher and higher data rates (e.g., 3.2 Gb for DDR4), it becomes difficult to ensure timing of DQ. DM, and DQS signals, thereby making training of such signals essential for proper memory system operation.

BRIEF DESCRIPTION OF THE DRAWINGS

Various ones of the appended drawings merely illustrate example embodiments of the present disclosure and should not be considered as limiting its scope.

DETAILED DESCRIPTION

Figure 1:
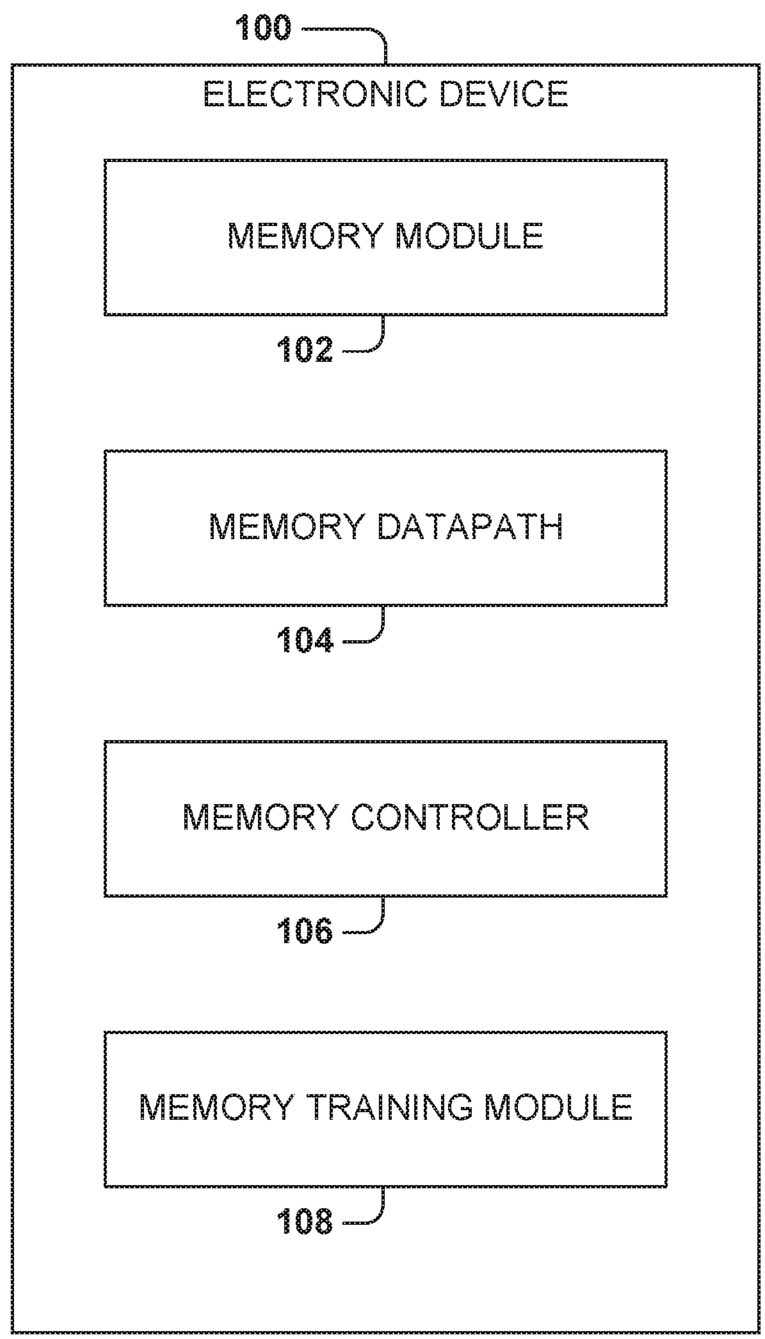
FIG. 1 is a block diagram illustrating an example electronic device that includes a module for memory training (or calibration), in accordance with various embodiments.

Various embodiments provide for determining a delay of a data (e.g., DQ) signal with respect to a data strobe (e.g., DQS) signal within a memory system comprising a memory controller and a memory module. In particular, some embodiments adjust a phase between a data signal and a data strobe signal such that a data eye of the data signal arrives at a receiver latch of a memory module can be centered on a transition of the data strobe signal (e.g., the DQS signal is positioned in the middle of the data eye of the DQ signal). By centering the data eye with the transition of the data strobe signal, various embodiments can ensure that the data strobe signal transition falls between the leading and trailing edges of the data eye, which, in turn, permits the memory module to obtain correct data from the memory controller during a write operation.

As used herein, a data eye of a signal may refer to its characteristic appearance of the signal as a waveform. For instance, a data eye of a DQ signal may refer to a characteristic appearance of a data signal waveform on a DQ line for a particular bit. The data eye of the DQ signal can be defined by two edges, and between the two edges the data may be correctly latched by a memory module. A particular DQ signal may correspond to a DQ bit of a memory module that can be written to, or read from, by a memory controller.

Additionally, various embodiments provide for determining a delay of a data mask (DM) signal with respect to a data strobe (DQS) signal within a memory system comprising a memory controller and a memory module. Some embodiments may be implemented with respect to certain non-LPDDR4 memory systems, such as DDR3, DDR4, or LPDDR3 memory systems.

Various embodiments described herein may be part of a training or calibration process performed with respect to a memory system that comprises a memory module and a memory controller. An embodiment may train or calibrate one or more data (DQ) signals, one or more data mask (DM) signals relating to the one or more data signals, or both.

According to some embodiments, a memory controller reads out (e.g., via burst read command) a set of data (e.g., a burst length of bytes, such as eight bytes) from a start memory address on a memory module, and stores the set of data on a register, such as an internal register of the memory controller. Some embodiments adjust a DQ signal with respect to a DQS signal by causing the memory controller to: write (e.g., via burst write command) a first data pattern to the start memory address; read out (e.g., via burst read command) data from the start memory address as a second data pattern; compare the first data pattern to the second data pattern (e.g., bitwise XOR operation); determine whether a leading edge of a data eye of a DQ signal has been detected (e.g., found) based on the comparison; and responsive to the leading edge not being detected, adjust (e.g., increment by a unit or step) a delay of a DQ signal (e.g., the DQ slave delay). This first series of operations may be repeated until the leading edge of the data eye of the DQ signal is detected (e.g., found). The first data pattern may comprise a random data pattern (e.g., generated by a memory controller), a data pattern generated by a linear-feedback shift register (LFSR), or a user-defined data pattern. The first data pattern may be, for example, 8-bit or 16-bit in size. Thereafter, some embodiments cause the memory controller to: write (e.g., via burst write command) the first data pattern to the start memory address, read out (e.g., via burst read command) data from the start memory address as a second data pattern; compare the first data pattern to the second data pattern; determine whether a trailing edge of the data eye of the DQ signal has been detected (e.g., found) based on the comparison; and responsive to the trailing edge not being detected, adjust (e.g., increment by a unit or step) the delay of the DQ signal (e.g., the DQ slave delay). The second data pattern may be the same size as the first data pattern (e.g., 8-bit or 16-bit in size). This second series of operations may be repeated until the trailing edge of the data eye of the DQ signal is detected (e.g., found). Subsequently, various embodiments determine the delay of the DQ signal (e.g., the DQ slave delay), based on the leading edge and the trailing edge (e.g., delay associated with the leading edge and the delay associated with the trailing edge). In particular, the DQ delay may be determined according to the following formula:

$$DQ\text{ delay} = \frac{(\text{leading\_edge\_delay} + \text{trailing\_edge\_delay})}{2}.$$

Eventually, various embodiments may write (e.g., via write burst command) the set of data, initially stored in the register (e.g., of the memory controller), back to the start memory address on the memory module, thereby restoring to the memory module the data originally stored at the start memory address prior to the DQ delay adjustment process.

The foregoing process may be performed for a plurality (e.g., all) of bits of a DQ data path between a memory controller and a memory module, thereby individually adjusting the DQ delay of each bit in the plurality of bits. The foregoing process may be performed substantially in parallel (e.g., by the memory controller) with respect to each bit in the plurality of bits.

Subsequent to setting DQ delays for a plurality of bits, some embodiments adjust a data mask (DM) signal with respect to a DQS signal for one or more of the plurality of bits. In particular, some embodiments adjust a DM signal with respect to a DQS signal by causing the memory controller to: write (e.g., via burst write command) a first data pattern to the start memory address while the DM is set to inactive; write (e.g., via burst write command) an inverted version of the first data pattern to the start memory address while the DM is set to a data mask data pattern; read out (e.g., via burst read command) data from the start memory address as a second data pattern, compare the second data pattern to an expected data pattern; determine whether a leading edge of a data eye of a DM signal has been detected (e.g., found) based on the comparison; and responsive to the leading edge not being detected, adjust (e.g., increment by a unit or step) a delay of the DM signal. This first series of operations may be repeated until the leading edge of a data eye of the DM signal is detected (e.g., found). Thereafter, some embodiments cause the memory controller to: write (e.g., via burst write command) the first data pattern to the start memory address while the DM is set to inactive; write (e.g., via burst write command) the inverted version of the first data pattern to the start memory address while the DM is set to the data mask data pattern; read out (e.g., via burst read command) data from the start memory address as a second data pattern; compare the second data pattern to an expected data pattern; determine whether a trailing edge of the data eye of a DM signal has been detected (e.g., found) based on the comparison; and responsive to the trailing edge not being detected, adjust (e.g., increment by a unit or step) a delay of the DM signal. This second series of operations may be repeated until the trailing edge of the data eye of the DM signal is detected (e.g., found). For data comparison purposes, if a DM bit that is set to high (e.g., set to the binary value of 1) corresponds to an unmasked value, the expected data pattern may comprise:

NOT(DQ data pattern) XOR NOT(DM data pattern).

Alternatively, if a DM bit that is set to low (e.g., set to the binary value of 0) corresponds to an unmasked value, the expected data pattern may comprise:

NOT(DQ data pattern) XOR (DM data pattern).

Subsequently, various embodiments set the delay of the DM signal, based on the leading edge and the trailing edge (e.g., delay associated with the leading edge and the delay associated with the trailing edge). In particular, the DM delay may be set according to the following formula:

$$DM\text{ delay} = \frac{(\text{leading\_edge\_delay} + \text{trailing\_edge\_delay})}{2}$$

To set the DM delay, for some embodiments, a memory controller writes the DM delay value to a memory physical layer (e.g., DDR PHY) communicatively coupling the memory controller and the memory module.

Depending on the embodiment, a start memory address may be selected at random, selected according to a predefined setting (e.g., manufacturer default), or selected by a user.

Reference will now be made in detail to embodiments of the present disclosure, examples of which are illustrated in the appended drawings. The present disclosure may, however, be embodied in many different forms and should not be construed as being limited to the embodiments set forth herein.

FIG. 1 is a block diagram illustrating an example electronic device 100 that includes a module for memory training (or calibration), in accordance with various embodiments. The electronic device 100 may comprise any electronic device that uses a memory and a processor, such as a central processor unit (CPU) or a graphics processing unit (GPU). For instance, the electronic device 100 may comprise, without limitation, a computer (e.g., a server computer, a client computer, a personal computer (PC), a tablet computer, a laptop computer, a netbook), a set-top box (STB), a personal digital assistant (PDA), an entertainment media system, a cellular telephone, a smart phone, a mobile device, a wearable device (e.g., a smart watch), a smart home device (e.g., a smart appliance), other smart devices, a web appliance, a network router, a network switch, a network bridge, or any electronic device capable of executing instructions with respect to a memory.

As shown, the electronic device 100 includes a memory module 102, a memory data path 104, a memory controller 106, and a memory training module 108 that performs memory training, in accordance with various embodiments. Any one or more of the modules described may be implemented using hardware alone or a combination of hardware and software. Moreover, any two or more modules of the electronic device 100 may be combined into a single module, and the functions described herein for a single module may be subdivided among multiple modules.

To avoid obscuring illustrated embodiments with unnecessary detail, various functional components (e.g., modules) that are not germane to conveying an understanding of the illustrated embodiments have been omitted from FIG. 1. Various additional functional components may be supported by the electronic device 100 to facilitate additional functionality that is not specifically described herein.

The memory module 102 comprises one or more memory cells or memory devices, each of which may comprise some form of random access memory (RAM), such as Dynamic Random-Access Memory (DRAM) or Static Random-Access Memory (SRAM). The memory module 102 may be packaged as a single in-line memory modules (SIMM) or a dual in-line memory module (DIMM) that can be plugged into an electronic device including an appropriate socket. For some embodiments, the memory module 102 comprises Double Data Rate (DDR) Synchronous Dynamic Random-Access Memory (SDRAM), such as Double Data Rate 3 (DDR3), Double Data Rate 4 (DDR4), Low Power Double Data Rate 3 (LPDDR3).

The memory data path 104 comprises one or more electronic signal paths coupling together the memory module 102 and the memory controller 106 (e.g., individual lines between pins of the memory module 102 and the memory controller 106) such that data, address, command, control, clock, and other information can be carried between the memory module 102 and the memory controller 106. For example, the memory data path 104 may comprise an interconnect, such a link or a bus. Accordingly, the memory data path 104 may carry one or more electronic signals between the memory module 102 and the memory controller 106. Among the electronic signals carried, the memory data path 104 may carry one or more data signals for data to be written to, or read from, the memory module 102 (e.g., a memory device of the memory module 102). Additionally, the memory data path 104 may carry one or more control signals, which can facilitate writing data to, or reading data from, the memory module 102 (e.g., a memory device of the memory module 102).

For some embodiments, the memory data path 104 comprises a set of input/output data (DQ) signals, where each DQ signal is for writing a data bit to, and reading a data bit from, the memory module 102 (e.g., a memory cell of the memory module 102). A plurality of DQ signals of the memory data path 104 may be grouped as a byte lane that facilitates transfer of a byte of data between the memory module 102 and the memory controller 106. The memory data path 104 may comprise a set of data strobe (DQS) signals corresponding to the set of DQ signals, where a particular DQS signal, in the set of DQS signals, is used to strobe a data bit being written to the memory module 102 via the particular DQ signal, in the set of DQ signals, during a memory write operation (e.g., a burst write operation).

For some embodiments, the memory data path 104 comprises a set of data mask (DM) signals, where each DM signal masks an input data bit transmitted from the memory controller 106 to the memory module 102 (e.g., a memory cell of the memory module 102) via a DQ signal. As such, each DM signal can indicate which DQ signals should be interpreted as valid data or non-valid data during a sampling period, which is indicated by corresponding DQS signals.

The memory controller 106 manages exchange of data to and from the memory module 102 via the memory data path 104. To facilitate this, the memory controller 106 may exchange data, address, command, control, clock, and other information with the memory module 102 over the memory data path 104. For some embodiments, the memory controller 106 transmits a set of DQS signals to the memory module 102 during write operations (e.g., burst write operations), and writes and reads data with respect to the memory module 102 using a set of DQ signals. Additionally, for some embodiments, the memory controller 106 transmits a set of DM signals (e.g., according to a DM data pattern), which can cause the memory module 102 to mask one or more of DQ signals being written to the memory module 102, by the memory controller 106, during a write operation. Depending on the embodiment, the memory controller 106 may be an integrated memory controller (IMC), which may be part of a processor or a system-on-a-chip (SoC).

The memory training module 108 facilitates the training of one or more DQ signals between the memory controller 106 and the memory module 102, as described herein. The memory training module 108 may further facilitate the training of one or more DM signals between the memory controller 106 and the memory module 102, as described herein. The memory training module 108 may facilitate training of the one or more DM signals only if data masking is determined to be enabled for the memory module 102. Additionally, the memory training module 108 may facilitate training of the one or more DM signals only after training of the one or more DQ signals has been completed. The memory training module 108 may train the one or more DQ signals, the one or more DM signals, or both, relative to one or more DQS signals between the memory controller 106 and the memory module 102. Despite being illustrated as a separate component in FIG. 1, some or all of the memory training module 108 may part of the memory controller 106. More regarding training DQ and DM signals according to various embodiments is described below with respect to FIGS. 2 through 10.

Figure 2:
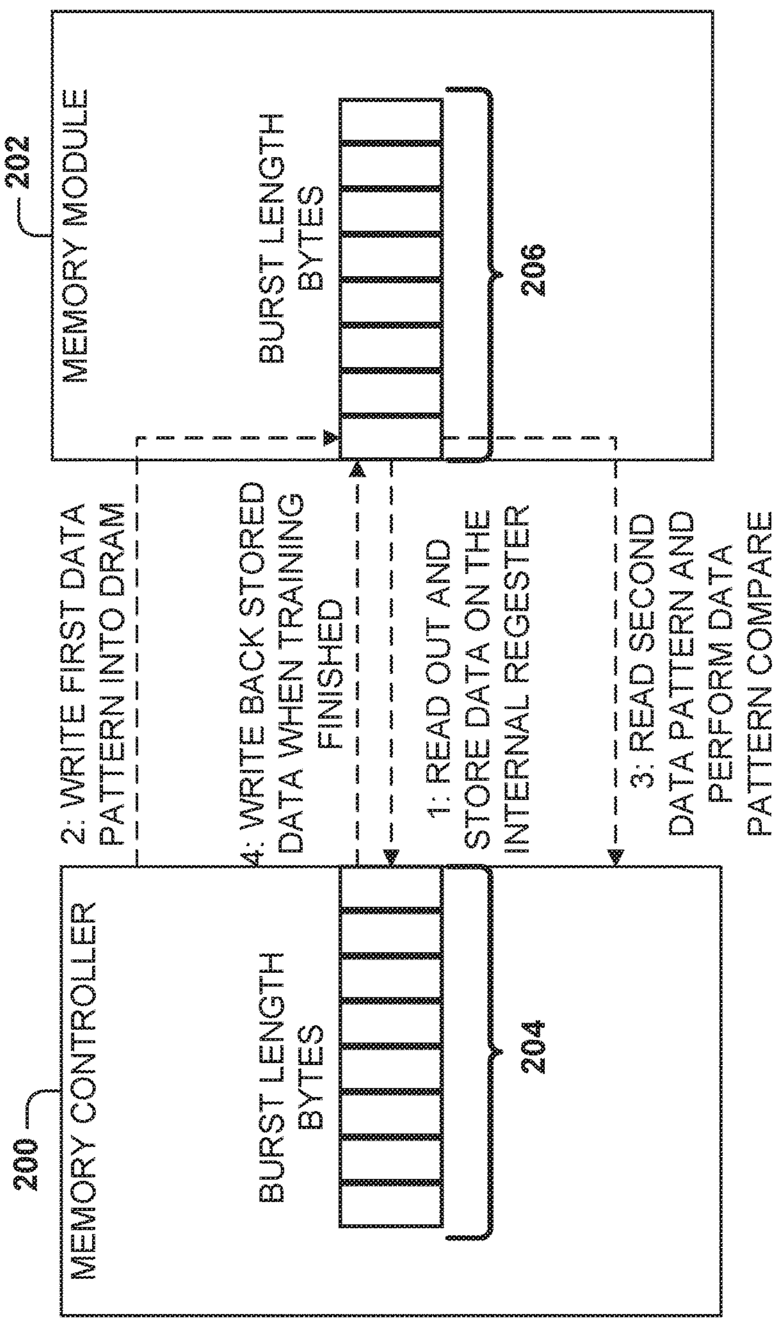
FIG. 2 is a flow diagram illustrating an example exchange of data between a memory controller and a memory module during memory training, in accordance with various embodiments.

FIG. 2 is a flow diagram illustrating an example exchange of data between a memory controller 200 and a memory module 202 during memory training, in accordance with various embodiments. To avoid obscuring illustrated embodiments with unnecessary detail, various functional components (e.g., modules) that are not germane to conveying an understanding of the illustrated embodiments have been omitted from FIG. 2. Various additional functional components may be supported by the memory controller 200 and the memory module 202 to facilitate additional functionality that is not specifically described herein.

As shown, the memory controller 200 reads out an initial set of data from a start memory address of the memory module 202 and stores the initial set of data on an internal register of the memory controller 200. The read operation may be a burst read operation supported by the memory controller 200 and the memory module 202 and, as such, the initial set of data may comprise a burst length of bytes (e.g., eight bytes) from the memory module 202. The initial set of data may represent original data stored on the memory module 202, at the start memory address, prior to training one or more data signals (e.g., DQ signals) between the memory controller 200 and the memory module 202.

Next, the memory controller 200 writes a first data pattern to the memory module 202 at the start memory address. The read operation may be a burst write operation supported by the memory controller 200 and the memory module 202 and, as such, the first data pattern may comprise a burst length of bytes. In FIG. 2, the first data pattern is represented by bytes 206.

Next, the memory controller 200 reads a second data pattern from the start memory address of the memory module 202. The read operation may be a burst read operation supported by the memory controller 200 and the memory module 202 and, as such, the second data pattern read from the memory module 202 may comprise a burst length of bytes. In FIG. 2, the second data pattern is represented by bytes 204. The memory controller 200 compares the first data pattern, written to the start memory address, to the second data pattern read (back) from the start memory address.

Subsequently, the memory controller 200 adjusts a delay of a data signal, between the memory controller 200 and the memory module 202, based on the comparison of the first data pattern and the second data pattern. In particular, the memory controller 200 may detect and identify a leading edge of the data signal, and may detect and identify a trailing edge of the data signal, based on the comparison of the first data pattern and the second data pattern. The memory 200 may adjust the delay of the data signal (e.g., by a step) unless both the leading edge and the trailing have been detected and identified.

For some embodiments, the memory controller 200 repeats the operations of writing a first data pattern to the memory module 202 at the start memory address, reading a second data pattern from the start memory address of the memory module 202, and comparing the first data pattern and the second data pattern until both the leading edge and the trailing edge of the data signal are identified. Additionally, for some embodiments, the memory controller 200 repeats the operations until the memory controller 200 identifies the leading edge and the trailing edge of each of a plurality of data signals (e.g., all data signals) between the memory controller 200 and the memory module 202. The search for trailing and leading edges of each data signal, in a plurality of data signals, may be performed concurrently (in parallel) based on the comparison of the first data pattern and the second data pattern.

Upon determining the leading edge and the trailing edge for a particular data signal, the memory controller 200 determines a data signal delay (e.g., DQ slave delay) for the particular data signal based on a delay of the leading edge relative to a data strobe (e.g., DQS) signal and a delay of the trailing edge relative to the data strobe signal. In particular, the data signal delay may be set according to the following:

$$\text{Data signal delay} = \frac{(\text{leading\_edge\_delay} + \text{trailing\_edge\_delay})}{2}.$$

For some embodiments, the memory controller 200 determines the data signal delay for each data signal in a plurality of data signals (e.g., all data signals) between the memory controller 200 and the memory module 202.

Figure 3:
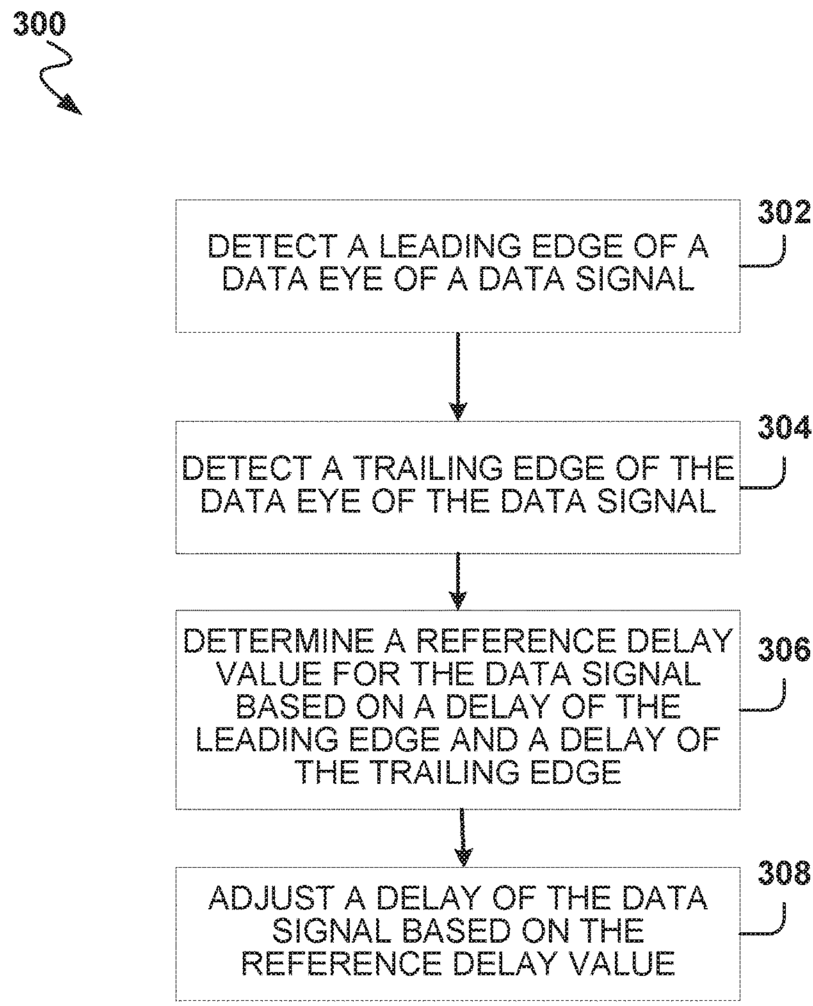
FIG. 3 is a flowchart illustrating an example method for memory training with respect to a data signal, in accordance with various embodiments.

FIG. 3 is a flowchart illustrating an example method 300 for memory training with respect to a data signal, in accordance with various embodiments. It will be understood that example methods described herein may be performed by various hardware components (e.g., DRAM module, IMC, processor, and the like), software components (e.g., firmware modules), or some combination of both. For instance, the method 300 may be performed by the electronic device 100 and its associated components (e.g., the memory controller 106) described herein with respect to FIG. 1. Depending on the embodiment, an operation of an example method described herein may involve intervening operations not shown. Additionally, though the operations of example methods may be depicted and described in a certain order, the order in which the operations are performed may vary among embodiments, including performing certain operations in parallel. Though the method 300 is described herein with respect to a single data signal, for various embodiments, one or more operations of the method 300 (e.g., operations 302, 304, 306, and 308) may be performed concurrently for a plurality of data signals (e.g., all data signals) between a memory controller and a memory module.

For some embodiments, the method 300 may be repeated for each different reference voltage for operating the memory module. This may occur upon detection of certain types of memory within the memory module, such as where the memory module is detected to include DDR4 memory. The different reference voltages may be determined based on a table of reference voltages supported by the memory module.

The method 300 as illustrated begins with operation 302 detecting, by a memory controller coupled to a memory module, a leading edge of a data eye of a data signal between the memory controller and the memory module. For some embodiments, operation 302 detects the leading edge of the data eye in accordance with a method 400 as described herein with respect to FIG. 4.

The method 300 continues with operation 304 detecting, by the memory controller, a trailing edge of the data eye of the data signal between the memory controller and the memory module. For some embodiments, operation 304 detects the trailing edge of the data eye in accordance with the method 400 as described herein with respect to FIG. 4.

The method 300 continues with operation 306 determining, by the memory controller, a reference delay value for the data signal based on a delay of the leading edge (the leading edge detected at operation 302) relative to a data strobe (e.g., DQS) signal and a delay of the trailing edge (the trailing edge detected at operation 304) relative to the data strobe signal. According to various embodiments, the reference delay value for the data signal is determined according to the following formula:

$$\text{New data signal delay} = \frac{(\text{leading\_edge\_delay} + \text{trailing\_edge\_delay})}{2}.$$

The delay of the leading edge and the delay of the trailing edge may be individually determined (e.g., calculated) prior to the reference delay value being determined.

The method 300 continues with operation 308 adjusting, by the memory controller, the delay of the data signal, relative to a data strobe signal between the memory controller and the memory module, based on the reference delay value determined at operation 306. Where the data signal comprises a DQ signal, adjusting the delay of the data signal may comprise adjusting the DQ slave delay associated with the DQ signal. For some embodiments, adjusting the delay of the data signal comprises setting the delay equal to the reference delay value determined at operation 306.

Figure 4:
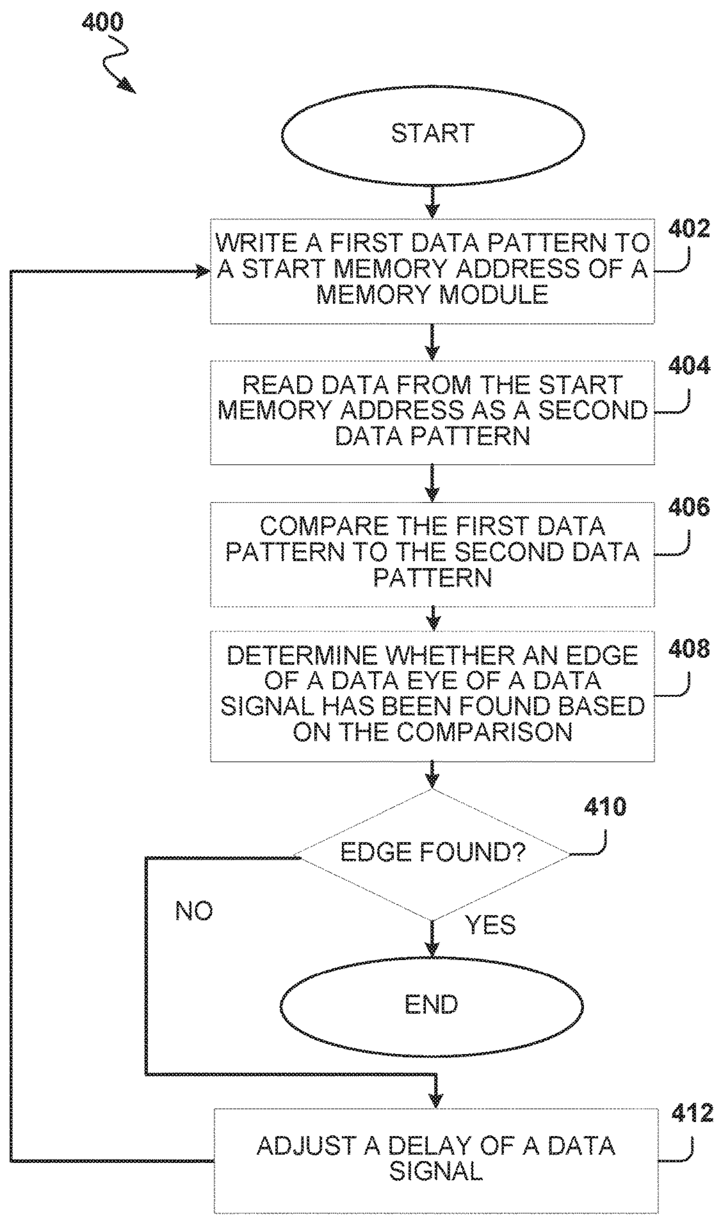
FIG. 4 is a flowchart illustrating an example method for memory training with respect to a data signal, in accordance with various embodiments.

FIG. 4 is a flowchart illustrating an example method 400 for memory training with respect to a data signal, in accordance with various embodiments. Though the method 400 is described herein with respect to a detecting an edge for a single data signal, for various embodiments, one or more operations of the method 400 (e.g., operations 408 and 412) may be performed concurrently for a plurality of data signals (e.g., all data signals) between a memory controller and a memory module. For some embodiments, the method 400 is performed (e.g., by operation 302 of the method 300) once to detect a leading edge of a data signal and, subsequently, is performed again (e.g., by operation 304 of the method 300) to detect a trailing edge of the data signal.

The method 400 as illustrated begins with operation 402 writing, by a memory controller, a first data pattern to a start memory address of a memory module coupled to the memory controller. The writing may comprise a burst write operation, where the first data pattern may comprise a burst length of bytes that is written to the start memory address of the memory module. As noted herein, the first data pattern may comprise a random data pattern (e.g., generated by a memory controller), a data pattern generated by a linear-feedback shift register (LFSR), or a user-defined data pattern.

The method 400 continues with operation 404 reading, by the memory controller, data from the start memory address (of the memory module) as a second data pattern. The reading may comprise a burst read operation, where the second data pattern may comprise a burst length of bytes read (back) from the start memory address of the memory module.

The method 400 continues with operation 406 comparing (e.g., by the memory controller) the first data pattern to the second data pattern. The comparing may comprise performing exclusive-or (XOR) operation on the first data pattern and the second data pattern.

The method 400 continues with operation 408 determining whether an edge, a leading edge or a trailing edge) of a data signal has been detected (e.g., found) based on the comparison at operation 406. At decision point 410, if the edge has been detected (e.g., found), the method 400 ends.

Alternatively, if the edge is not detected (e.g., found), the method 400 continues with operation 412 adjusting the delay of the data signal. For some embodiments, adjusting the delay of the data signal comprises increasing the delay by a predetermined amount of units, such as a minimum unit for the delay (e.g., by a step, which may represent 10 ps). Where the data signal comprises a DQ signal, the delay may comprise a DQ slave delay associated with the DQ signal. Where the method 400 is performed for a plurality of data signals (e.g., all DQ signals) between a memory controller and a memory module, each data signal in the plurality may have its own adjustable delay. After operation 412, the method returns to operation 402 so that the method 400 repeats itself.

Figure 5:
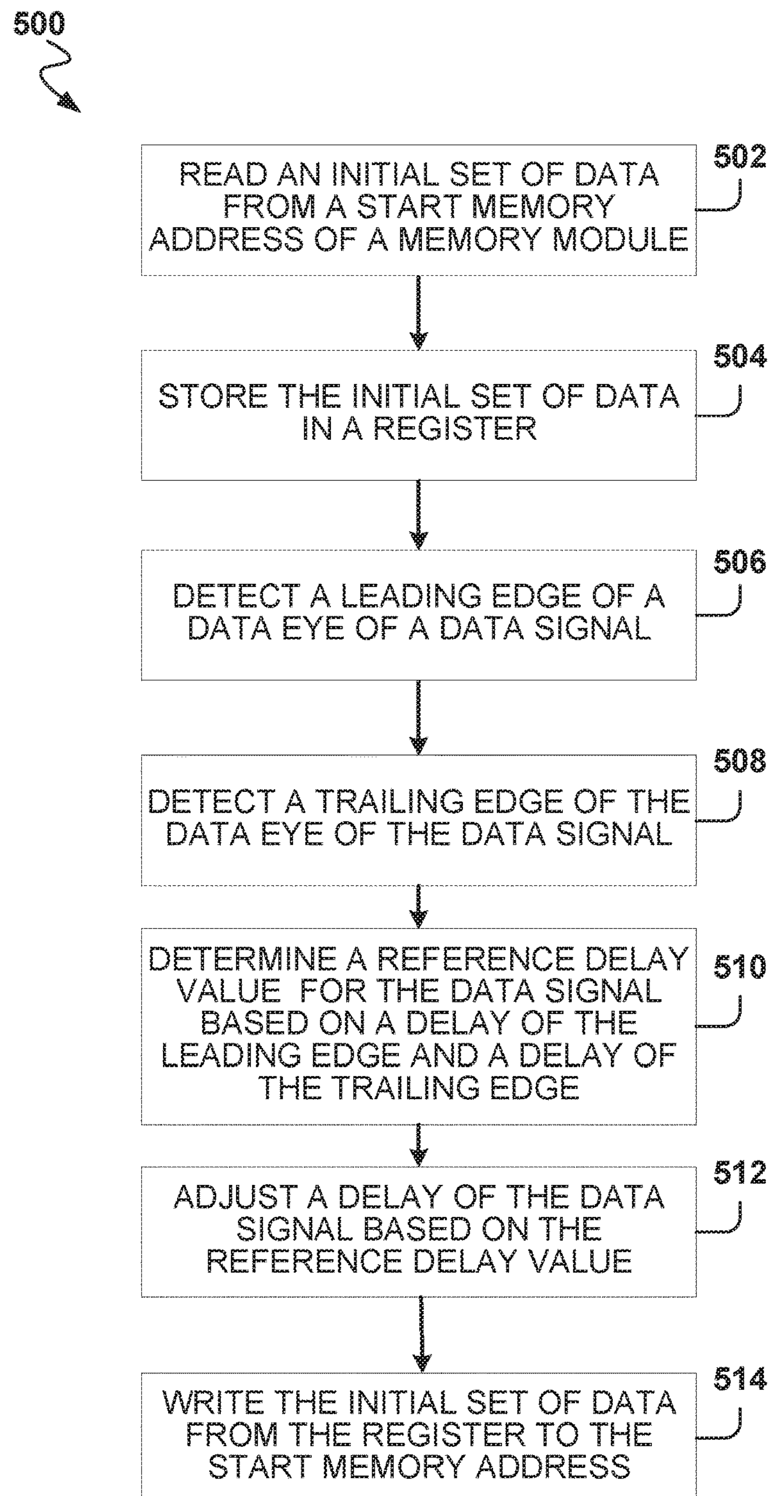
FIG. 5 is a flowchart illustrating an example method for memory training with respect to a data signal, in accordance with various embodiments.

FIG. 5 is a flowchart illustrating an example method 500 for memory training with respect to a data signal, in accordance with various embodiments. Though the method 500 is described herein with respect to a single data signal, for various embodiments, one or more operations of the method 500 (e.g., operations 506, 508, 510, and 512) may be performed concurrently for a plurality of data signals (e.g., all data signals) between a memory controller and a memory module.

The method 500 as illustrated begins with operation 502 reading, by a memory module, an initial set of data from a start memory address of a memory module. The reading may comprise a burst read operation that reads a burst length of bytes from the start memory address. The method 500 continues with operation 504 storing, by the memory controller, the initial set of data in a register (e.g., of the memory controller). In doing so, an embodiment may store data originally stored at the start memory address prior to a data signal delay adjustment process, thereby permitting the stored data to be restored to the start memory address after the data signal delay adjustment process is complete.

The method 500 continues with operations 506 through 512, which according to various embodiments, are respectively similar to operations 302 through 308 of the method 300 described with respect to FIG. 3. The method 500 continues with operation 514 writing, by the memory controller, the initial set of data from the register to the start memory address of the memory module. In doing so, the original data read from the start memory address, prior to the data signal delay adjustment process, can be restored to the start memory address.

Figure 6:
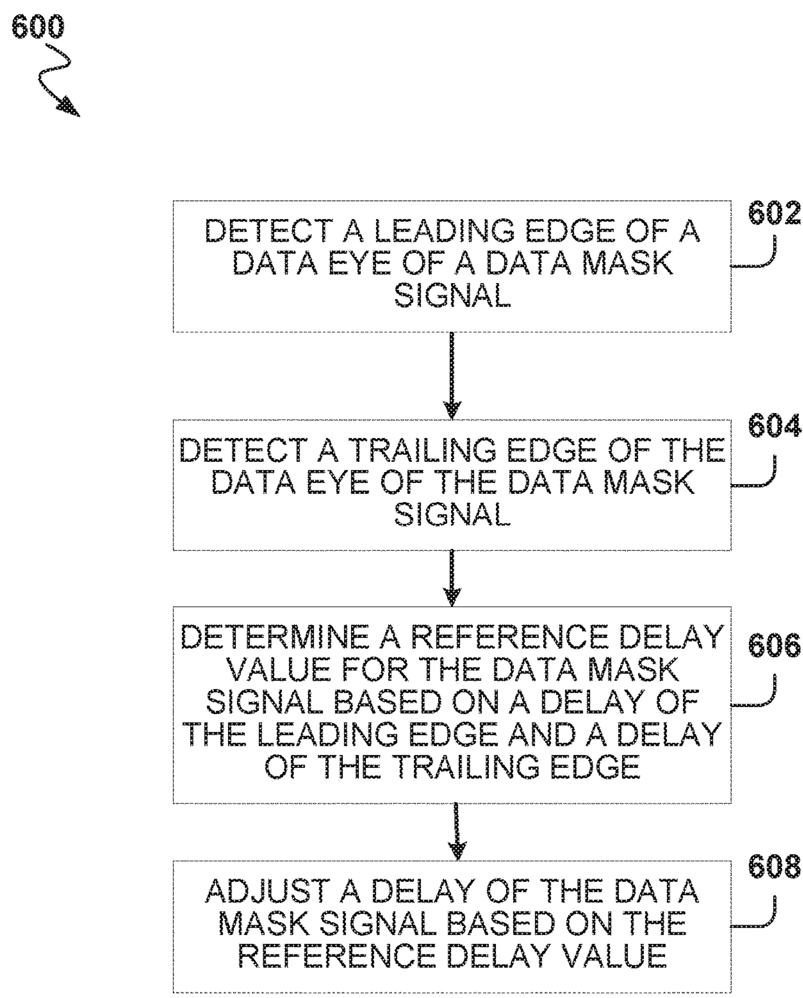
FIG. 6 is a flowchart illustrating an example method for memory training with respect to a data mask signal, in accordance with various embodiments.

FIG. 6 is a flowchart illustrating an example method 600 for memory training with respect to a data mask signal, in accordance with various embodiments. Though the method 600 is described herein with respect to a single data mask signal, for various embodiments, one or more operations of the method 600 (e.g., operations 602, 604, 606, and 608) may be performed concurrently for a plurality of data mask signals (e.g., all data mask signals) between a memory controller and a memory module.

The method 600 as illustrated begins with operation 602 detecting, by a memory controller coupled to a memory module, a leading edge of a data eye of a data mask signal between the memory controller and the memory module. For some embodiments, operation 602 detects the leading edge of the data eye in accordance with a method 700 as described herein with respect to FIG. 7.

The method 600 continues with operation 604 detecting, by the memory controller, a trailing edge of the data eye of the data mask signal between the memory controller and the memory module. For some embodiments, operation 604 detects the trailing edge of the data eye in accordance with the method 700 as described herein with respect to FIG. 7.

The method 600 continues with operation 606 determining, by the memory controller, a reference delay value for the data mask signal based on a delay of the leading edge (the leading edge detected at operation 602) relative to a data strobe (e.g., DQS) signal and a delay of the trailing edge (the trailing edge detected at operation 604) relative to the data strobe signal. According to various embodiments, the reference delay value for the data mask signal is determined according to the following formula:

$$\text{New data mask signal delay} = \frac{(\text{leading\_edge\_delay} + \text{trailing\_edge\_delay})}{2}.$$

The delay of the leading edge and the delay of the trailing edge may be individually determined (e.g., calculated) prior to the reference delay value being determined.

The method 600 continues with operation 608 adjusting, by the memory controller, the delay of the data mask signal, relative to a data strobe signal between the memory controller and the memory module, based on the reference delay value determined at operation 606. Where the data mask signal comprises a DM signal, adjusting the delay of the data mask signal may comprise adjusting the DM delay associated with the DM signal. For some embodiments, adjusting the delay of the data mask signal comprises setting the delay equal to the reference delay value determined at operation 606.

Figure 7:
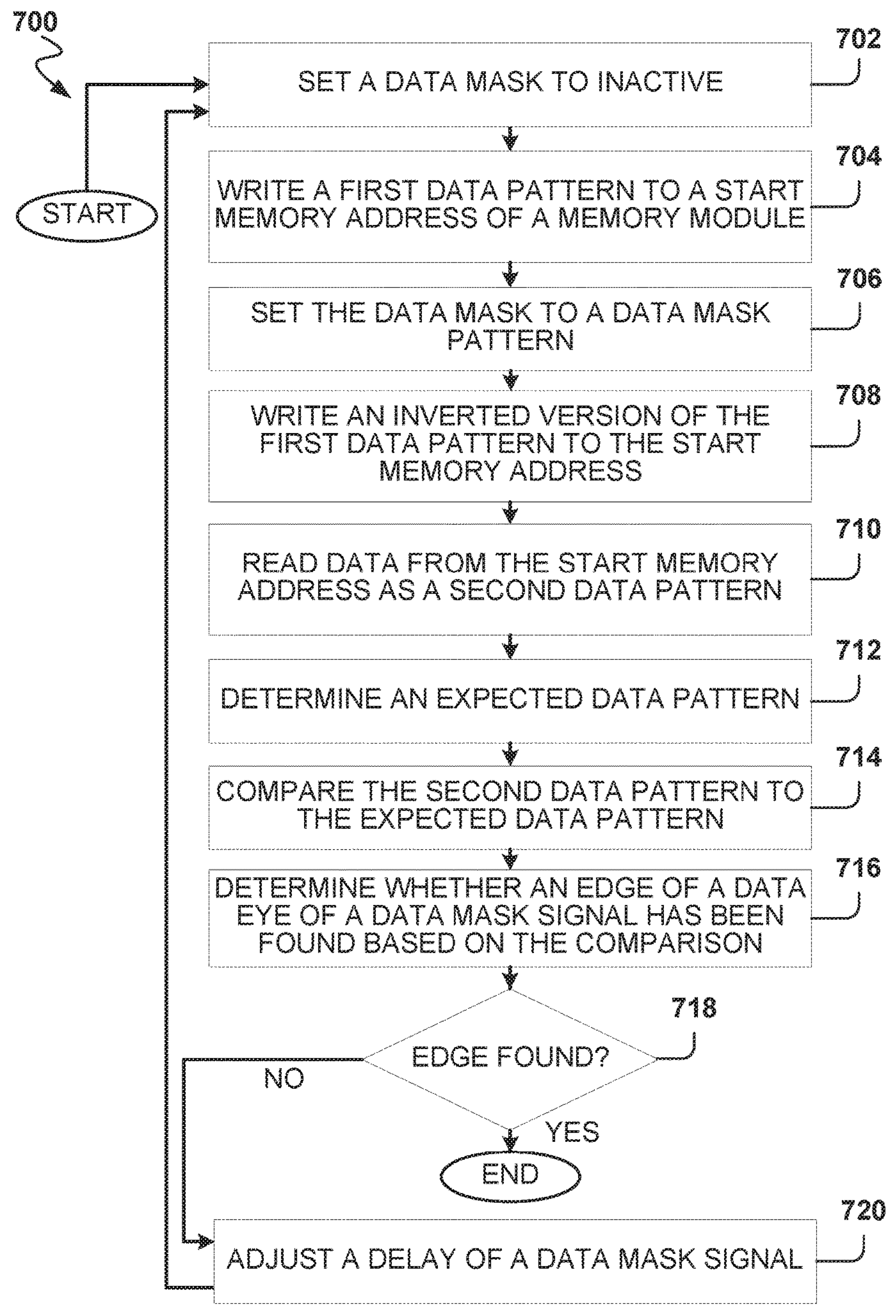
FIG. 7 is a flowchart illustrating an example method for memory training with respect to a data mask signal, in accordance with various embodiments.

FIG. 7 is a flowchart illustrating an example method 700 for memory training with respect to a data mask signal, in accordance with various embodiments. Though the method 700 is described herein with respect to detecting an edge for a single data mask signal, for various embodiments, one or more operations of the method 700 (e.g., operations 716 and 720) may be performed concurrently for a plurality of data mask signals (e.g., all data mask signals) between a memory controller and a memory module. For some embodiments, the method 700 is performed (e.g., by operation 602 of the method 600) once to detect a leading edge of a data mask signal and, subsequently, is performed again (e.g., by operation 604 of the method 600) to detect a trailing edge of the data mask signal.

The method 700 as illustrated begins with operation 702 setting, by a memory controller, a data mask to inactive (e.g., set the data mask to a value or data mask pattern representing that all signals are unmasked). The method 700 continues with operation 704 writing, by the memory controller, a first data pattern (e.g., hex value of "5AFF") to a start memory address of a memory module coupled to the memory controller. The writing may comprise a burst write operation, where the first data pattern may comprise a burst length of bytes that is written to the start memory address of the memory module. As noted herein, the first data pattern may comprise a random data pattern (e.g., generated by a memory controller), a data pattern generated by a linear-feedback shift register (LFSR), or a user-defined data pattern. The first data pattern may be, for example, 8-bit or 16-bit in size.

The method 700 continues with operation 706 setting, by the memory controller, the data mask to a data mask pattern. The data mask pattern may be, for example, 8-bit or 16-bit in size. Once set the data mask is set to a data mask pattern, each set of data signals (e.g., DQ signals) representing a byte being written to the memory module may be masked according to the data mask pattern. For example, the data mask pattern may comprise the hex value of "FF00," or its equivalent. Depending on the embodiment, the data mask may mask a particular data signal when a corresponding bit of the data mask is set to high (e.g., 1) by the data mask pattern, or may mask the particular data signal when the corresponding bit of the data mask is set to low (e.g., 0) by the data mask pattern.

The method 700 continues with operation 708 writing, by the memory controller, an inverted version of the first data pattern to the start memory address of the memory module. For example, if the first data pattern comprises the hex value of "5AFF," the inverted version of the first data pattern comprises the hex value of "A500."

The method 700 continues with operation 710 reading, by the memory controller, data from the start memory address (of the memory module) as a second data pattern. The reading may comprise a burst read operation, where the second data pattern may comprise a burst length of bytes read (back) from the start memory address of the memory module.

The method 700 continues with operation 712 determining (e.g., by the memory controller) an expected data pattern based on the first data pattern and the data mask pattern. According to some embodiments, if a data mask signal that is set to high (e.g., set to the binary value of 1) corresponds to an unmasked value, the expected data pattern may be determined according to the following:

NOT(first data pattern) XOR NOT(data mask pattern).

Alternatively, if a data mask signal that is set to low (e.g., set to the binary value of 0) corresponds to an unmasked value, the expected data pattern may be determined according to the following:

NOT(first data pattern) XOR (data mask pattern).

The method 700 continues with operation 714 comparing (e.g., by the memory controller) the second data pattern, read at operation 710, to the expected data pattern determined at operation 712. The comparing may comprise performing exclusive-or (XOR) operation on the first data pattern and the second data pattern.

The method 700 continues with operation 716 determining whether an edge, a leading edge or a trailing edge) of a data mask signal has been detected (e.g., found) based on the comparison at operation 706. At decision point 718, if the edge has been detected (e.g., found), the method 700 ends. Alternatively, if the edge is not detected (e.g., found), the method 700 continues with operation 720 adjusting the delay of the data mask signal. For some embodiments, adjusting the delay of the data mask signal comprises increasing the delay by a predetermined amount of units, such as a minimum unit for the delay (e.g., by a step, which may represent 10 ps). Where the method 700 is performed for a plurality of data mask signals (e.g., all DM signals) between a memory controller and a memory module, each data mask signal in the plurality may have its own adjustable delay. After operation 720, the method returns to operation 702.

Figure 8:
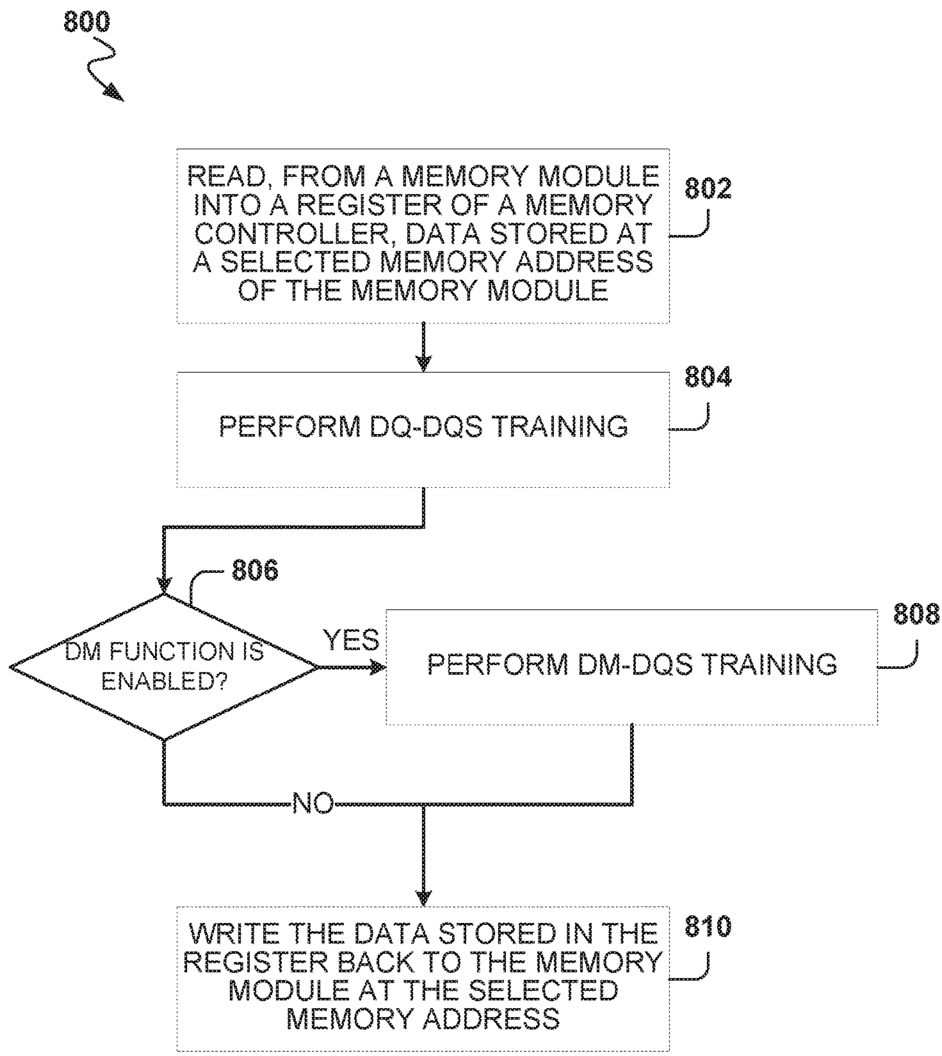
FIG. 8 is a flowchart illustrating an example method for memory training with respect to a data signal and a data mask signal, in accordance with various embodiments.

FIG. 8 is a flowchart illustrating an example method 800 for memory training with respect to a data signal and a data mask signal, in accordance with various embodiments. As noted herein, some or all of the method 800 may be performed by a memory controller coupled to a memory module.

The method 800 as illustrated begins with reading, from a memory module into a register of a memory controller, data stored at a selected memory address of the memory module. The method 800 continues with operation 804 performing data-data strobe (e.g., DQ-DQS) training in accordance with various embodiments described herein, such as the method 300 described with respect to FIG. 3. The method 800 continues with operation 806 determining whether a data mask (e.g., DM) function is enabled within the memory module. For some embodiments, this determination is performed by checking a value within a register of the memory module (e.g., MPR1 register of the memory module). If the data mask function is determined to be enabled, the method 800 continues with operation 808 performing data mask-data strobe (e.g., DM-DQS) training in accordance with various embodiments described herein, such as the method 600 described with respect to FIG. 6. From operation 808, the method 800 continues to operation 810. If the data mask function is determined not to be enabled, the method 800 skips operation 808 and continues to operation 810. Operation 810 writes the data stored in the register (at operation 802) back to the memory module at the selected memory address, thereby restoring the data contained at the selected memory address prior to the method 800 being performed.

Figure 9:
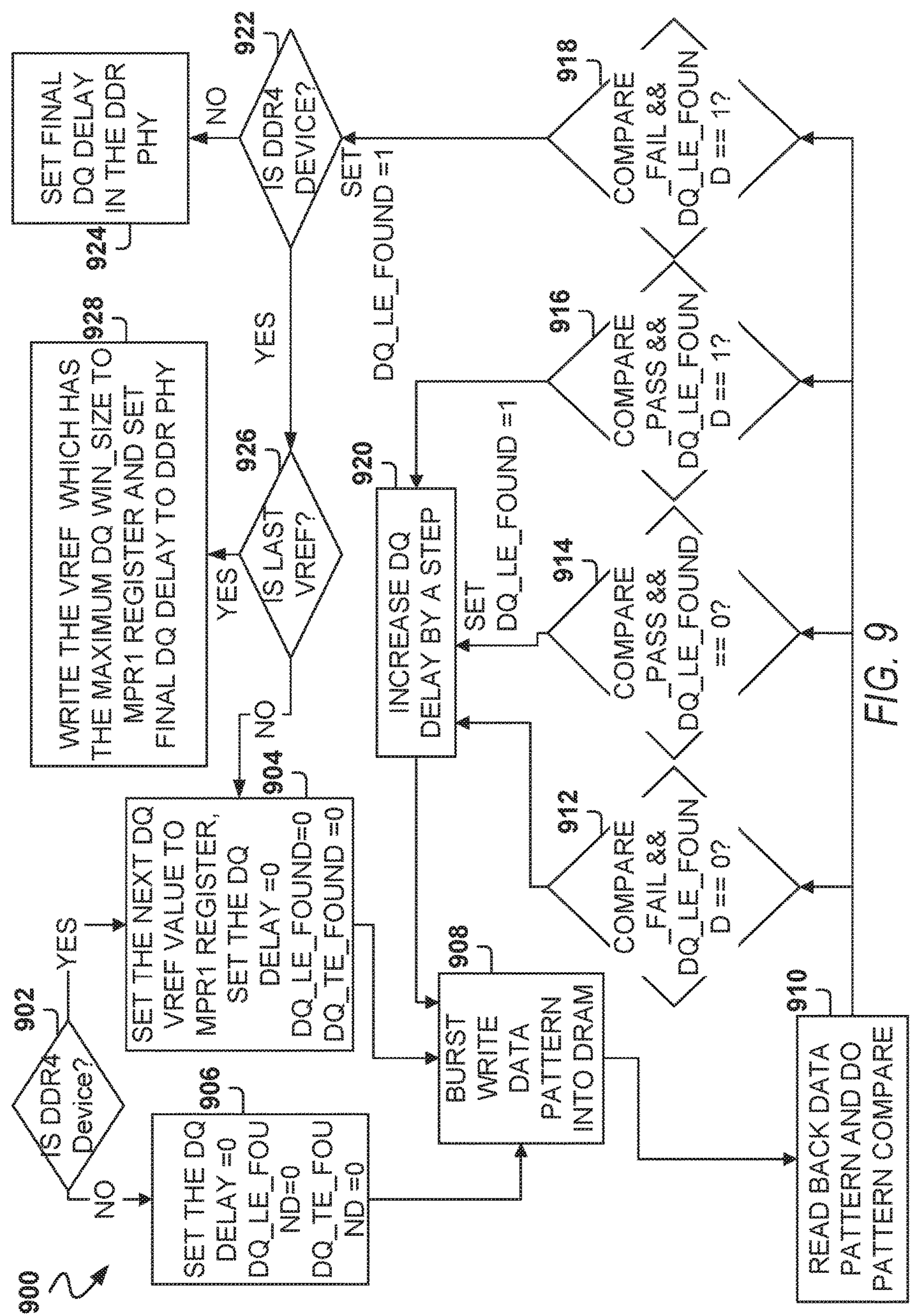
FIG. 9 is a flowchart illustrating an example method for memory training with respect to a data signal, in accordance with various embodiments.

FIG. 9 is a flowchart illustrating an example method 900 for memory training with respect to a data signal, in accordance with various embodiments. As noted herein, some or all of the method 900 may be performed by a memory controller coupled to a memory module. Additionally, though the method 900 is described herein with respect to a single data signal, for various embodiments, one or more operations of the method 900 may be performed concurrently for a plurality of data signals (e.g., all data signals) between a memory controller and a memory module.

As illustrated, the method 900 begins with decision point 902, where it is determined whether the memory module is a DDR4 memory device. If the memory module is a DDR4 memory device, the method 900 continues to operation 904. If the memory module is not a DDR4 memory device, the method 900 continues to operation 906.

Operation 904 sets a voltage reference value (e.g., DQ vref value) of the memory module to next available voltage reference value for the memory module. Where this is the first iteration of the method 900, the next available voltage reference value may be the first reference voltage value (e.g., from a table of reference voltage values) supported by the memory module. The voltage reference value of the memory module may be set to a particular reference voltage value by writing the value to a register of the memory module (e.g., the MPR1 register). Additionally, operation 904 initializes the internal variables dq_delay, dq_le_found, and dq_te_found to zero. The internal variable dq_delay represents a calculated delay for a data (e.g., DQ) signal being adjusted by the method 900. The internal variable dq_le_found and dq_te_found are flags to respectively indicate whether a leading edge and a trailing edge has been found for the data (e.g., DQ) signal. From operation 904, the method 900 continues to operation 908.

Operation 906 initializes the internal variables dq_delay, dq_le_found, and dq_te_found to zero. From operation 906, the method 900 continues to operation 908.

Operation 908 burst writes a first data pattern (e.g., DQ data pattern) into the memory module (e.g., DRAM) at a start memory address. The method 900 continues with operation 910 reading back a data from the start memory address as a second data pattern and comparing the second data pattern with the first data pattern. If the compare passes (e.g., the data patterns match), operation 910 sets an internal variable compare_pass to true and compare_fail to false, otherwise operation 910 sets compare_pass to false and compare_fail to true. If a leading edge is detected by the compare, operation 910 sets an internal variable dq_le_found to 1, otherwise operation 910 sets dq_le_found to 0. Additionally, if a trailing edge is detected by the compare, operation 910 sets an internal variable dq_te_found to 1, otherwise operation 910 sets dq_te_found to 0.

From operation 910, the method 900 continues to decision point 912 if compare_fail is true and dq_le_found is set to 0, continues to decision point 914 if compare_pass is true and dq_le_found is set to 0, continues to decision point 916 if compare_pass is true and dq_le_found is set to 1, and continues to decision point 918 if compare_fail is true and dq_le_found is set to 1. Decision point 912 is satisfied where the comparison of the data patterns fails at operation 910 and the leading edge of the data signal has not been found (e.g., by detection) yet by operation 910. Decision point 914 is satisfied where the comparison of the data patterns passes at operation 910, and the leading edge of the data signal has now been found (e.g., by detection) by operation 910, so the leading edge internal variable needs to be updated accordingly (dq_le_found is still set to 0 and should be set to 1). Decision point 916 is satisfied where the comparison of the data patterns passes at operation 910 and the leading edge of the data signal has been found (e.g., by detection) by operation 910, which means the trailing edge has yet to be found (e.g., by detection) by the operation 910. Finally, decision point 918 is satisfied where the comparison of the data patterns fails at operation 910 and the leading edge of the data signal has been found (e.g., by detection) yet by operation 910, which means the trailing edge has now been found by the operation 910.

As shown, from decision points 912 and 916, the method 900 continues to operation 920. If decision point 914 is satisfied, the decision point 914 sets dq_le_found to 1 and the method 900 continues to operation 920. From decision point 918, the method 900 continues to decision point 922.

Operation 920 increases a delay associated with the data signal (e.g., DQ delay) by a step, which can represent a minimum unit by which the delay can be increased. From operation 920, the method 900 returns to operation 908 to perform another iteration of operations 908 and 910.

Decision point 922 determines whether the memory module is a DDR4 memory device. If the memory module is a DDR4 memory device, the method 900 continues to decision point 926. If the memory module is not a DDR4 memory device, the method 900 continues with operation 924 setting a final delay value (e.g., final DQ delay). For some embodiments, operation 924 sets the delay by writing the final delay value into physical layer of the memory module (e.g., DDR PHY layer). Additionally, for some embodiments, the final delay value is determined according to the following formula:

$$\text{Final delay value} = \frac{(\text{leading\_edge\_delay} + \text{trailing\_edge\_delay})}{2}.$$

The leading edge delay may be the delay associated with the leading edge found by operation 910, and the trailing edge delay may be the delay associated with the trailing edge found by operation 910.

If the memory module is a DDR4 memory device, the method 900 continues to decision point 926, where it determined whether the last reference voltage value (e.g., from a table of reference voltage values) supported by the memory module has already been reached and used. If there is next reference voltage value (e.g., DQ vref) available for the memory module, the method 900 continues to operation 904, thereby permitting the method 900 to perform another iteration while the memory module is set to the next reference voltage value.

If the last reference voltage value supported by the memory module has already been reached and used, the method 900 continue to operation 928. Operation 928 can compare the data (e.g., DQ) window sizes for all reference voltage values (e.g., DQ vrefs) used by operation 904 during operation of the method 900, and determines which of those reference voltage values is associated with the largest (e.g., maximum) data window size. For some embodiments, the data (e.g., DQ) window size associated with a particular reference voltage value may be determined according to the following formula:

Data Window Size=trailing_edge_delay−leading_edge_delay, where the trailing edge delay corresponds to a delay of the trailing edge relative to a data strobe (e.g., DQS) signal found while the memory module was set to the particular reference voltage value, and where the leading edge delay corresponds to a delay of the leading edge relative to the data strobe signal found while the memory module was set to the particular reference voltage value. Operation 928 sets the reference voltage value of the memory module to a particular reference voltage value associated with the largest data (e.g., DQ) window size determined by operation 928. The voltage reference value of the memory module may be set to a particular reference voltage value by writing the value to a register of the memory module (e.g., the MPR1 register). As noted herein, the voltage reference value of the memory module may be set to the particular reference voltage value by writing the particular reference voltage value to the MPR1 register of the memory module.

Additionally, operation 928 sets a final delay value (e.g., final DQ delay) based on the trailing edge found while the memory module was set to the particular reference voltage value associated with the largest data (e.g., DQ) window size, and based on the leading edge found while the memory module was set to the particular reference voltage value associated with the largest data window size. For some embodiments, the final delay value is determined according to the following formula:

$$\text{Final delay value} = \frac{(\text{leading\_edge\_delay} + \text{trailing\_edge\_delay})}{2}.$$

The trailing edge delay may correspond to a delay of the trailing edge relative to a data strobe (e.g., DQS) signal found while the memory module was set to the particular reference voltage value associated with the largest data window size, and the leading edge delay may correspond to a delay of the leading edge relative to the data strobe signal found while the memory module was set to the particular reference voltage value associated with the largest data window size.

Figure 10:
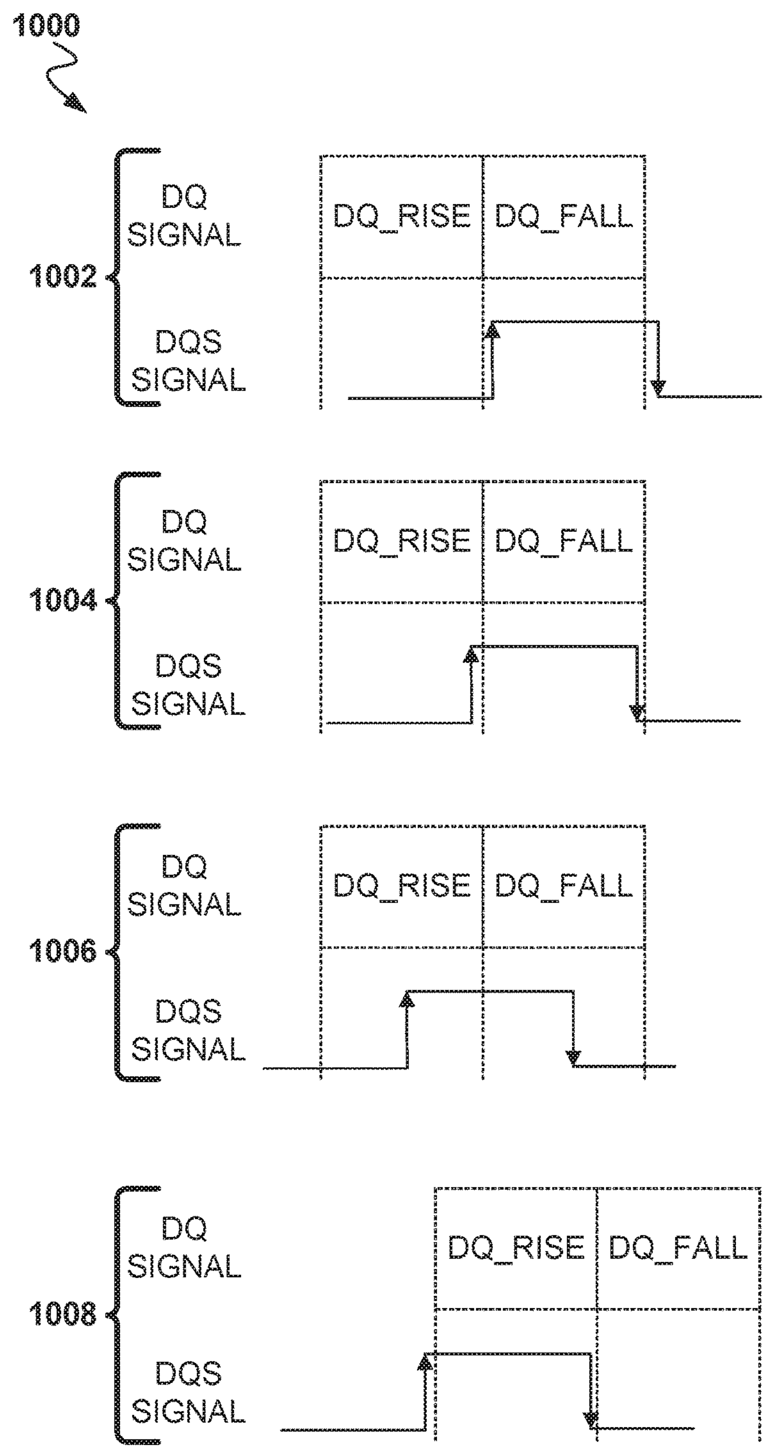
FIG. 10 is a diagram illustrating the edges of example data signals that comprise DQ signals relative to data strobe signals that comprise DQS signals, during memory training, in accordance with various embodiments.

FIG. 10 is a diagram 1000 illustrating the edges of example data signals that comprise DQ signals relative to data strobe signals that comprise DQS signals, during memory training, in accordance with various embodiments. In particular, signals 1002 through 1008 illustrate the decision points 912 through 918 with respect to the method 900. Signals 1002 illustrate a circumstance where the decision point 912 is satisfied. As noted herein, decision point 912 is satisfied where the comparison of the data patterns fails at operation 910 and the leading edge of the data signal has not been detected (e.g., found) yet by operation 910.

Signals 1004 illustrate a circumstance where the decision point 914 is satisfied. As noted herein, decision point 914 is satisfied where the comparison of the data patterns passes at operation 910, and the leading edge of the data signal has now been detected (e.g., found) by operation 910, so the leading edge internal variable need to be updated accordingly (dq_le_found is still set to 0 and should be set to 1).

Signals 1006 illustrate a circumstance where the decision point 916 is satisfied. As noted herein, decision point 916 is satisfied where the comparison of the data patterns passes at operation 910 and the leading edge of the data signal has been detected (e.g., found) by operation 910, which means the trailing edge has yet to be detected (e.g., found) by the operation 910.

Signals 1008 illustrate a circumstance where the decision point 918 is satisfied. As noted herein, decision point 918 is satisfied where the comparison of the data patterns fails at operation 910 and the leading edge of the data signal has been detected (e.g., found) yet by operation 910, which means the trailing edge has now been detected (e.g., found) by the operation 910.

Figure 11:
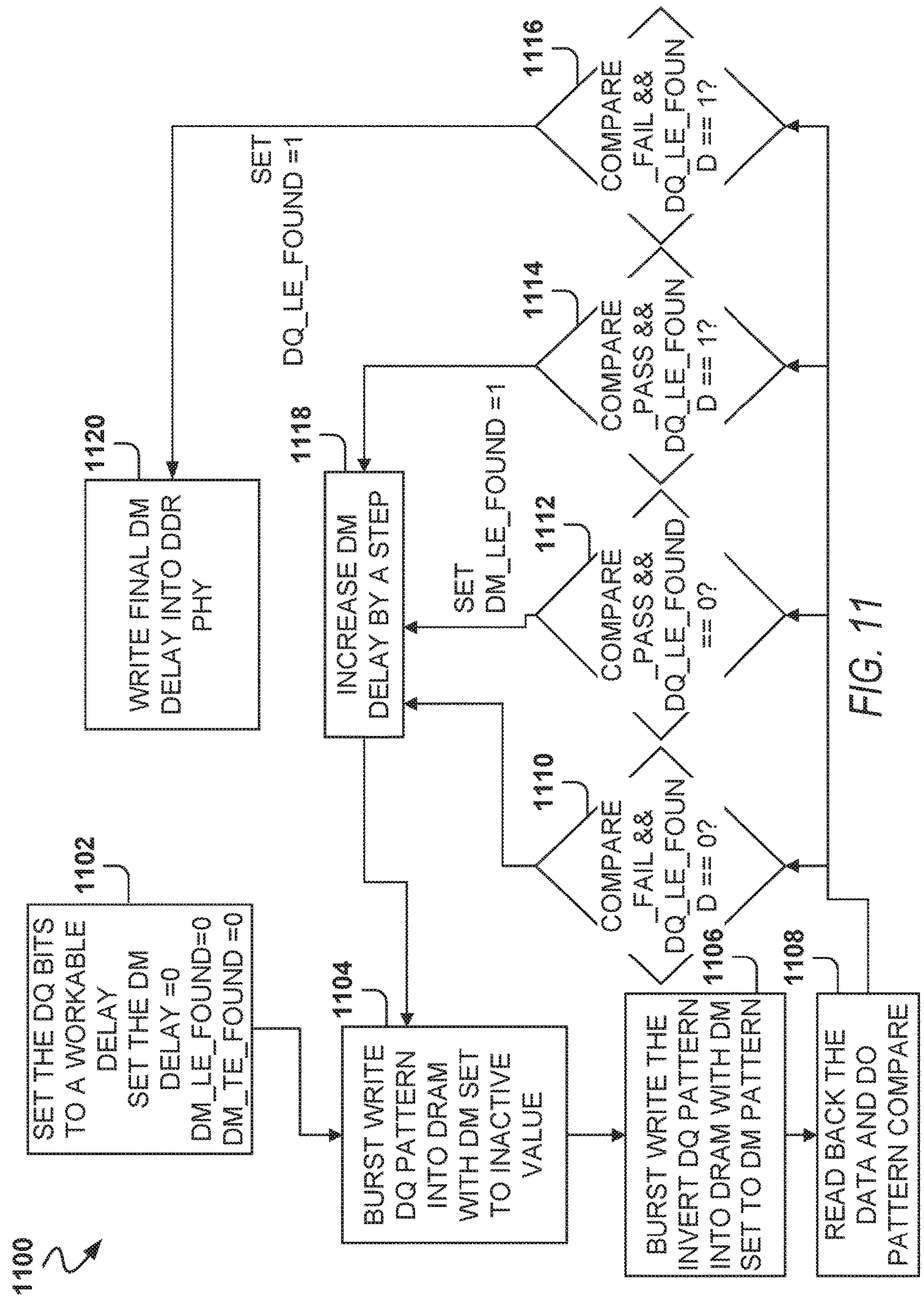
FIG. 11 is a flowchart illustrating an example method for memory training with respect to a data mask signal, in accordance with various embodiments.

FIG. 11 is a flowchart illustrating an example method 1100 for memory training with respect to a data mask signal, in accordance with various embodiments. As noted herein, some or all of the method 1100 may be performed by a memory controller coupled to a memory module. Additionally, though the method 900 is described herein with respect to a single data mask signal, for various embodiments, one or more operations of the method 900 may be performed concurrently for a plurality of data mask signals (e.g., all data mask signals) between a memory controller and a memory module. According to various embodiments, the method 1100 is performed subsequent to one or more data (e.g., DQ) signals being trained in accordance with various embodiments described herein, such as the method 900 described with respect to FIG. 9.

As illustrated, the method 1100 begins with operation 1102 set one or more data (e.g., DQ) signals, corresponding to data (e.g., DQ) bits, to a workable delay (e.g., by the method 900). Additionally, operation 1102 initializes the internal variables dm_delay, dm_le_found, and dm_te_found to zero. The internal variable dm_delay represents a calculated delay for a data mask (e.g., DM) signal being adjusted by the method 1100. The internal variable dm_le_found and dm_te_found are flags to respectively indicate whether a leading edge and a trailing edge has been found for the data mask (e.g., DM) signal.

The method 1100 continues with operation 1104 writing (e.g., burst writing) a data pattern (e.g., DQ data pattern) to a start memory address of the memory module while a data mask (e.g., DM) is set to an inactive value (e.g., value representing unmasking the data signals). The method 1100 continues with operation 1106 writing (e.g., burst writing) an inverted version of the data pattern (e.g., DQ data pattern) to the start memory address of the memory module while the data mask (e.g., DM) is set to a data mask pattern (e.g., DM data pattern). The method 1100 continues with operation 1108 reading back data from the start memory address of the memory module and performing a comparison of the data read with an expected data pattern. As noted herein, if a data mask signal that is set to high (e.g., set to the binary value of 1) corresponds to an unmasked value, the expected data pattern may be determined according to the following:

NOT(first data pattern) XOR NOT(data mask pattern).

Alternatively, if a data mask signal that is set to low (e.g., set to the binary value of 0) corresponds to an unmasked value, the expected data pattern may be determined according to the following:

NOT(first data pattern) XOR (data mask pattern).

If the compare passes (e.g., the data patterns match), operation 1108 sets an internal variable compare_pass to true and compare_fail to false, otherwise operation 1108 sets compare_pass to false and compare_fail to true. If a leading edge is detected by the compare, operation 1108 sets an internal variable dm_le_found to 1, otherwise operation 1108 sets dm_le_found to 1. Additionally, if a trailing edge is detected by the compare, operation 1108 sets an internal variable dm_te_found to 1, otherwise operation 1108 sets dm_te_found to 1.

From operation 1108, the method 1100 continues to decision point 1110 if compare_fail is true and dm_le_found is set to 0, continues to decision point 1112 if compare_pass is true and dm_le_found is set to 0, continues to decision point 1114 if compare_pass is true and dm_le_found is set to i, and continues to decision point 1116 if compare_fail is true and dm_le_found is set to 1. Decision point 1110 is satisfied where the comparison of the data patterns fails at operation 1108 and the leading edge of the data signal has not been found (e.g., detected) yet by operation 1108. Decision point 1112 is satisfied where the comparison of the data patterns passes at operation 1108, and the leading edge of the data signal has now been found (e.g., detected) by operation 1108, so the leading edge internal variable needs to be updated accordingly (dm_le_found is still set to 0 and should be set to 1). Decision point 1114 is satisfied where the comparison of the data patterns passes at operation 1108 and the leading edge of the data signal has been found (e.g., detected) by operation 1108, which means the trailing edge has yet to be found (e.g., detected) by the operation 1108. Finally, decision point 1116 is satisfied where the comparison of the data patterns fails at operation 1108 and the leading edge of the data signal has been found (e.g., detected) by operation 1108, which means the trailing edge has now been found by the operation 1108.

As shown, from decision points 1110 and 1114, the method 1100 continues to operation 1118. If decision point 1112 is satisfied, the decision point 1112 sets dm_le_found to 1 and the method 1100 continues to operation 1118. From decision point 1116, the method 1100 continues to operation 1120.

Operation 1118 increases a delay associated with the data mask signal (e.g., DM delay) by a step, which can represent a minimum unit by which the delay can be increased. From operation 1118, the method 1118 returns to operation 1104 to perform another iteration of operations 1106 and 1108.

Operation 1120 sets a final delay value (e.g., final DM delay). For some embodiments, operation 1120 sets the delay by writing the final delay value into physical layer of the memory module (e.g., DDR PHY layer). Additionally, for some embodiments, the final delay value is determined according to the following formula:

$$\text{Final delay value} = \frac{(\text{leading\_edge\_delay} + \text{trailing\_edge\_delay})}{2}.$$

The leading edge delay may be the delay associated with the leading edge found by operation 1108, and the trailing edge delay may be the delay associated with the trailing edge found by operation 1108.

Figure 12:
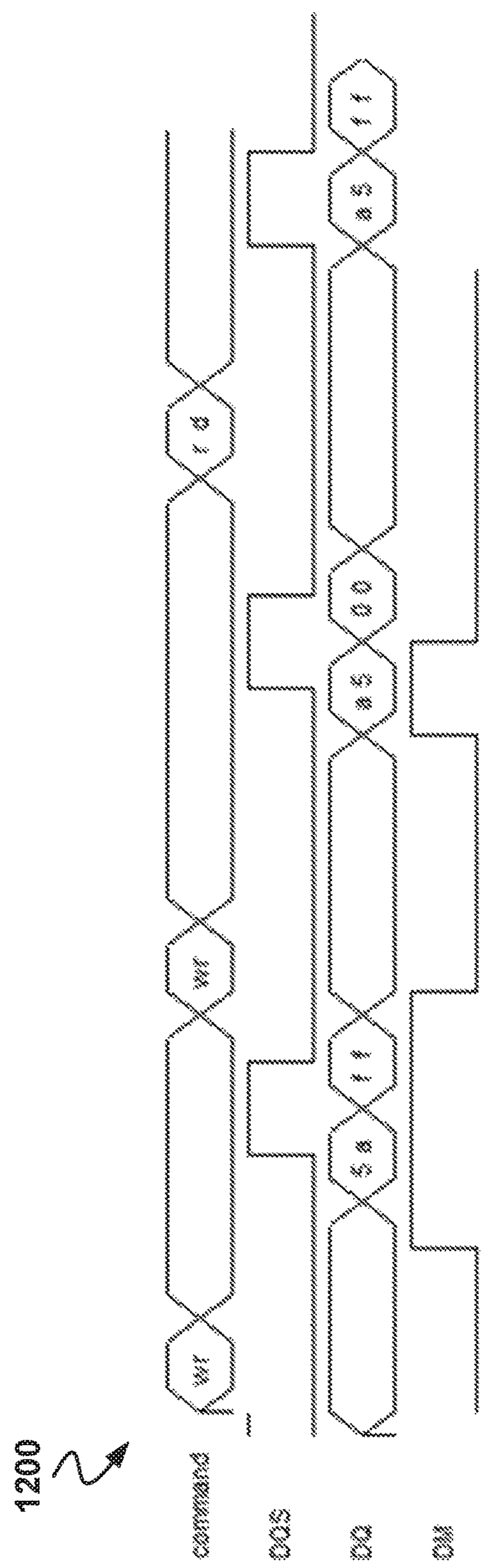
FIG. 12 is a diagram illustrating the example signals during memory training of a data mask signal, in accordance with various embodiments.

FIG. 12 is a diagram illustrating the example signals 1200 during memory training of a data mask signal, in accordance with various embodiments. In particular, FIG. 12 illustrates command signals, DQS signals, DQ signals, and DM signals during memory training of the DM signals in accordance with various embodiments. As shown, a DQ data pattern comprising a hex value of "5AFF" is written (via the first "WR" command) into the memory module at a start memory address while the DM signals are set to a high value, which represents an unmask value. Next, an inverted version of the DQ data pattern, having a hex value of "A500," is written (via the second "WR" command") to the memory module at the start memory address while the DM signal is set to a data mask pattern comprising a hex value of "FF00" (or its equivalent. For example, the data mask pattern may comprise a binary value of "10" where the data mask is 2-bit in size, the first bit value may apply to first byte of DQ signals and the second bit value may apply to the second byte of DQ signals. Subsequently, a data pattern is read (via the "RD" command) back from the start memory address of the memory module. As shown, the data pattern read back comprises a hex value of "5AFF." As noted herein, where high value represents an unmask value, the following formula can be used to determine the expected data pattern:

NOT(DQ data pattern) XOR NOT(DM data pattern).

According to this formula, the expected data pattern comprises a hex value of "5AFF," which matches the data pattern read back from the start memory address.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The detailed description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. The terms "a" or "an" should be read as meaning "at least one," "one or more," or the like. The use of words and phrases such as "one or more," "at least," "but not limited to," or other like phrases shall not be read to mean that the narrower case is intended or required in instances where such broadening phrases may be absent.

Boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The description above includes systems, methods, devices, instructions, and computer media (e.g., computing machine program products) that embody illustrative embodiments of the disclosure. In the description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

What is claimed is:

1. A method comprising:

detecting, by a memory controller coupled to a memory module, a leading edge of a data eye of a data signal between the memory module and the memory controller;

detecting, by the memory controller, a trailing edge of the data eye of the data signal;

determining, by the memory controller, a reference delay value for the data signal based on a delay of the leading edge relative to a data strobe signal and a delay of the trailing edge relative to the data strobe signal; and adjusting, by the memory controller, the delay of the data signal, relative to the data strobe signal between the memory controller and the memory module, based on the reference delay value.

2. The method of claim 1, wherein the detecting the leading edge of a data eye of the data signal comprises repeating the following operations until the leading edge is found:

writing a first data pattern to a start memory address of the memory module;

reading data from the start memory address as a second data pattern;

comparing the first data pattern to the second data pattern;

determining whether the leading edge has been found based on the comparison; and responsive to the leading edge not being found, adjusting the delay of the data signal.

3. The method of claim 1, wherein the detecting the trailing edge of the data eye of the data signal comprises repeating the following operations until the trailing edge is found:

writing a first data pattern to a start memory address of the memory module;

reading data from the start memory address as a second data pattern;

comparing the first data pattern to the second data pattern;

determining whether the trailing edge has been found based on the comparison; and responsive to the trailing edge not being found, adjusting the delay of the data signal.

4. The method of claim 1, further comprising:

determining, by the memory controller, the delay of the leading edge based on the leading edge; and determining, by the memory controller, the delay of the trailing edge based on the trailing edge.

5. The method of claim 1, wherein the data signal comprises a DQ signal.

6. The method of claim 1, wherein the determining the delay of the data signal based on the delay of the leading edge and the delay of the trailing edge comprises calculating the delay according to the following:

$$\frac{(\text{leading\_edge\_delay} + \text{trailing\_edge\_delay})}{2}.$$

7. The method of claim 1, further comprising, prior to detecting the leading edge and detecting the trailing edge:

reading, by the memory controller, an initial set of data from a start memory address on the memory module; and storing, by the memory controller, the initial set of data in a register of the memory controller.

8. The method of claim 7, further comprising, after detecting the leading edge and detecting the trailing edge:

writing, by the memory controller, the initial set of data from the register to the start memory address on the memory module.

9. The method of claim 1, wherein the data signal is part of a plurality of data signals, and wherein the detecting the leading edge and the detecting the trailing edge is performed for a data eye of each data signal in the plurality of data signals.

10. The method of claim 1, further comprising:

adjusting, by the memory controller, a delay of a data mask, signal between the memory controller and the memory module, with respect to the data strobe signal.

11. The method of claim 1, wherein the memory controller and the memory module are part of a non-Low Power Double Data Rate 4 (LPDDR4) memory system.

12. The method of claim 1, wherein the method is performed for each different reference voltage, in a plurality of reference voltages, for operating the memory module.

13. A method comprising:

detecting, by a memory controller coupled to a memory module, a leading edge of a data eye of a data mask signal between the memory module and the memory controller;

detecting, by the memory controller, a trailing edge of the data eye of the data mask signal;

determining, by the memory controller, a reference delay value for the data mask signal based on a delay of the leading edge relative to a data strobe signal and a delay of the trailing edge relative to the data strobe signal; and adjusting, by the memory controller, the delay of the data mask signal, relative to the data strobe signal between the memory controller and the memory module, based on the reference delay value.

14. The method of claim 13, wherein the detecting the leading edge of a data eye of the data mask signal comprises repeating the following operations until the leading edge is found:

setting a data mask to inactivate;

writing a first data pattern to a start memory address of the memory module;

setting the data mask to a data mask pattern;

writing an inverted version of the first data pattern to the start memory address;

reading data from the start memory address as a second data pattern;

determining an expected data pattern based on the first data pattern and the data mask pattern;

comparing the second data pattern to the expected data pattern;

determining whether the leading edge has been found based on the comparison; and responsive to the leading edge not being found, adjusting the delay of the data mask signal.

15. The method of claim 14, wherein a data mask bit set to high represents an unmasked value, and the expected data pattern is determined according to the following:

NOT(first data pattern) XOR NOT(data mask pattern).

16. The method of claim 14, wherein a data mask bit set to low represents an unmasked value, and the expected data pattern is determined according to the following:

NOT(first data pattern) XOR (data mask pattern).

17. The method of claim 13, wherein the detecting the trailing edge of the data eye of the data mask signal comprises repeating the following operations until the trailing edge is found:

setting a data mask to inactivate;

writing a first data pattern to a start memory address of the memory module;

setting the data mask to a data mask pattern;

writing an inverted version of the first data pattern to the start memory address;

reading data from the start memory address as a second data pattern;

determining an expected data pattern based on the first data pattern and the data mask pattern;

comparing the second data pattern to the expected data pattern;

determining whether the trailing edge has been found based on the comparison; and responsive to the trailing edge not being found, adjusting the delay of the data mask signal.

18. The method of claim 17, wherein a data mask bit set to high represents an unmasked value, and the expected data pattern is determined according to the following:

NOT(first data pattern) XOR NOT(data mask pattern).

19. The method of claim 17, wherein a data mask bit set to low represents an unmasked value, and the expected data pattern is determined according to the following:

NOT(first data pattern) XOR (data mask pattern).

20. A system comprising:

a memory module;

a memory controller;

a memory data path coupling the memory module and the memory controller, the memory data path communicating a plurality of data signals and a plurality of data strobe signals between the memory module and the memory controller; and a memory training module that causes the memory controller to perform the following operations for each particular data signal in the plurality of data signals;

detecting a leading edge of a data eye of the particular data signal;

detecting a trailing edge of the data eye of the particular data signal;

determining a reference delay value for the particular data signal based on a delay of the leading edge relative to a corresponding data strobe signal and a delay of the trailing edge relative to the corresponding data strobe signal; and adjusting the delay of the particular data signal, relative to the corresponding data strobe signal in the plurality of data strobe signals, based on the reference delay value.

* * * * *